United States Patent
Choi et al.

(10) Patent No.: US 10,026,595 B2
(45) Date of Patent: Jul. 17, 2018

(54) APPARATUS FOR FREQUENCY TUNING IN A RF GENERATOR

(71) Applicant: Advanced Energy Industries, Inc., Fort Collins, CO (US)

(72) Inventors: Myeong Yeol Choi, Fort Collins, CO (US); Denis Shaw, Fort Collins, CO (US); Mike Mueller, Loveland, CO (US); Jeffrey Roberg, Longmont, CO (US); Steve Jordan, Berthoud, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 15/657,525

(22) Filed: Jul. 24, 2017

(65) Prior Publication Data

US 2017/0323771 A1 Nov. 9, 2017

Related U.S. Application Data

(63) Continuation of application No. 15/133,461, filed on Apr. 20, 2016, now Pat. No. 9,748,076.

(51) Int. Cl.
*H05B 31/26* (2006.01)
*H01J 37/32* (2006.01)

(52) U.S. Cl.
CPC .... *H01J 37/32183* (2013.01); *H01J 37/3299* (2013.01); *H01J 37/32155* (2013.01)

(58) Field of Classification Search
CPC .......... H01J 37/32813; H01J 37/32146; H01J 37/32183; H01J 37/32165;
(Continued)

(56) References Cited

U.S. PATENT DOCUMENTS

| 5,543,689 A | 8/1996 | Ohta et al. |
| 6,020,794 A | 2/2000 | Wilbur |

(Continued)

FOREIGN PATENT DOCUMENTS

| EP | 0935406 A2 | 8/1999 |
| FR | 2895169 A1 | 6/2007 |

(Continued)

OTHER PUBLICATIONS

Clemente, Gianluigi, "European Office Action and Extended Search Report re Application No. 09724338.0", dated Jul. 21, 2014, p. 9, Published in: EP.

(Continued)

*Primary Examiner* — Douglas W Owens
*Assistant Examiner* — Wei Chan
(74) *Attorney, Agent, or Firm* — Neugeboren O'Dowd PC

(57) ABSTRACT

A radio-frequency (RF) generator is provided that includes an exciter, a power amplifier, a filter, a sensor, and a frequency-tuning subsystem. The frequency-tuning subsystem includes a non-transitory, tangible, machine-readable medium containing instructions to perform a method that includes receiving an impedance trajectory of the plasma load; receiving a reference point in a complex-reflection-coefficient plane, the reference point lying on a reference vector passing through the reference point and the origin; receiving, from the sensor, a measured impedance of the plasma load; determining a measurement angle between a reference vector and a line passing through the reference point and a point in the complex-reflection-coefficient plane corresponding to the measured impedance; scaling the measurement angle by a predetermined constant to produce a frequency step; adding the frequency step to the initial frequency to produce an adjusted frequency; and causing the (Continued)

exciter to generate a signal oscillating at the adjusted frequency.

16 Claims, 11 Drawing Sheets

(58) Field of Classification Search
CPC ........... H01J 37/32174; H01J 37/32917; H01J 37/3299; H01J 37/32935; H05H 2001/4682
USPC ............. 315/111.21; 156/345.44; 455/114.3, 455/125, 107, 114.2
See application file for complete search history.

(56) References Cited

U.S. PATENT DOCUMENTS

| | | | |
|---|---|---|---|
| 6,027,601 | A | 2/2000 | Hanawa |
| 6,383,554 | B1 | 5/2002 | Chang et al. |
| 6,472,822 | B1 | 10/2002 | Chen et al. |
| 6,707,255 | B2 | 3/2004 | Coumou et al. |
| 6,902,646 | B2 | 6/2005 | Mahoney et al. |
| 6,958,630 | B2 | 10/2005 | Wantanabe et al. |
| 7,145,398 | B2 | 12/2006 | Dalton et al. |
| 7,476,233 | B1 | 1/2009 | Wiener et al. |
| 7,477,711 | B2 | 1/2009 | Kalavitis et al. |
| 7,839,223 | B2 | 11/2010 | Van Zyl |
| 8,040,068 | B2 | 10/2011 | Coumou et al. |
| RE42,917 | E | 11/2011 | Hauer et al. |
| 8,576,013 | B2 | 11/2013 | Coumou |
| 8,674,606 | B2 | 3/2014 | Carter et al. |
| 8,781,415 | B1 | 7/2014 | Coumou et al. |
| 8,952,765 | B2 | 2/2015 | Fish, II et al. |
| 9,041,471 | B2 | 5/2015 | Coumou |
| 9,214,901 | B2 | 12/2015 | Owen |
| 9,294,100 | B2 | 3/2016 | Van Zyl |
| 2006/0066247 | A1 | 3/2006 | Koshiishi et al. |
| 2006/0262889 | A1 | 11/2006 | Kalvaitis et al. |
| 2009/0237170 | A1 | 9/2009 | Van Zyl et al. |
| 2010/0194195 | A1 | 8/2010 | Coumou et al. |
| 2011/0148303 | A1 | 6/2011 | Van Zyl et al. |
| 2012/0152914 | A1 | 6/2012 | Matsuura |
| 2013/0169359 | A1 | 7/2013 | Coumou |
| 2013/0214683 | A1 | 8/2013 | Valcore et al. |
| 2013/0222055 | A1 | 8/2013 | Coumou et al. |
| 2014/0028389 | A1 | 1/2014 | Coumou |
| 2014/0028398 | A1 | 1/2014 | Owen |
| 2014/0062305 | A1 | 3/2014 | Klein et al. |
| 2014/0097908 | A1 | 4/2014 | Fisk, II et al. |
| 2014/0155008 | A1* | 6/2014 | Van Zyl ............ H01J 37/32155 455/120 |
| 2014/0220913 | A1 | 8/2014 | Coumou et al. |
| 2014/0361690 | A1* | 12/2014 | Yamada ............ H01J 37/32091 315/111.21 |
| 2015/0270104 | A1 | 9/2015 | Van Zyl |

FOREIGN PATENT DOCUMENTS

| | | |
|---|---|---|
| JP | 09161994 A | 6/1997 |
| JP | 02884056 B2 | 4/1999 |
| JP | 2006-054148 | 2/2006 |
| TW | 418593 B | 1/2001 |
| WO | 2013099133 A1 | 7/2013 |

OTHER PUBLICATIONS

Gill, David Alan, "Response to European Office Action re Application No. 09724338.0", dated Feb. 10, 2015, p. 15, Published in: EP.

The Korean Intellectual Property Office, "Korean Office Action re Application No. 1020107021902", dated Jan. 12, 2012, p. 3, Published in: KR.

TIPO, "Taiwan Office Action re Application No. 102144318", dated Dec. 29, 2015, p. 13, Published in: TW.

Phu, Sanh D., "Office Action re U.S. Appl. No. 14/094,520", dated May 12, 2015, p. 27, Published in: US.

O'Dowd, Sean R., "Response to Office Action re U.S. Appl. No. 14/094,520", dated Sep. 14, 2015, p. 7, Published in: US.

Fernandez, Pedro C., "Office Action re U.S. Appl. No. 14/320,268", dated Feb. 19, 2016, p. 26, Published in: US.

Gruber, Stephen S., "Response to Office Action re U.S. Appl. No. 14/320,268", dated Jun. 20, 2016, p. 10, Published in: US.

Detering, Frank, "ISR and WO", "PCT International Search Report and Written Opinion", dated Jun. 20, 2017, p. 9, Publisher: PCT, Published in: PCT.

Chan, Wei, "United States Office Action re U.S. Appl. No. 15/133,461", dated Dec. 30, 2016, p. 37, Published in: US.

O'Dowd, Sean R., "Response to United States Office Action re U.S. Appl. No. 15/133,461", dated Mar. 16, 2017, p. 11, Published in: US.

Jung, Jong Han, "International Search Report re Application No. PCT/US09/037001", dated Oct. 16, 2009, Published in: PCT.

Nickitas-Etienne, "International Preliminary Report on Patentability re Application No. PCT/US2013/072748", dated Jun. 18, 2015, p. 6, Published in: CH.

Mitrovic, Bayer, "International Search Report and Written Opinion re Application No. PCT/US2013/072748", dated Feb. 25, 2014, p. 9, Published in: AU.

Rabbani, Firoozeh, "International Search Report and Written Opinion re Application No. PCT/US2015/037607", dated Sep. 21, 2015, p. 12, Published in: AU.

* cited by examiner

APPARATUS FOR FREQUENCY TUNING IN A RF GENERATOR

CLAIM OF PRIORITY UNDER 35 U.S.C. § 120

The present application for Patent is a Continuation of patent application Ser. No. 15/133,461 entitled "APPARATUS FOR FREQUENCY TUNING IN A RF GENERATOR" filed Apr. 20, 2016, pending, and assigned to the assignee hereof and hereby expressly incorporated by reference herein.

BACKGROUND

Field

The present disclosure relates generally to radio-frequency (RF) generators and, more specifically, to apparatuses and techniques for tuning the frequency of an RF generator that supplies power to a plasma processing chamber to change the impedance of the plasma load in a desired manner.

Background

In plasma processing, a radio-frequency (RF) generator is used to supply power to the plasma load. Today's advanced plasma processes include ever more complicated recipes and recipe-changing procedures in which load (plasma) impedance dynamically changes. This can make it challenging to match the source impedance of the RF generator with the load impedance of the plasma for efficient power transfer. Such impedance matching can be performed using a matching network, but this approach is relatively slow in the context of modern short-duration plasma processes. An alternative approach is to adjust the frequency of the RF generator, which alters the impedance of the plasma load. "Plasma load," in this context, includes the plasma itself and any matching network. Such an approach has the potential to be much faster than adjusting a matching network. It is also possible to combine the two techniques (one or more matching networks and frequency tuning).

Conventional frequency-tuning algorithms struggle with optimizing parameters for these advanced plasma processes because both frequency stability and rapid frequency tuning are required simultaneously. There is, therefore, a need in the art for an improved apparatus for frequency tuning in an RF generator.

SUMMARY

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents, and alternative constructions that fall within the spirit and scope of the invention as expressed in the claims.

An aspect may be characterized as a radio-frequency (RF) generator that includes an exciter that generates a signal oscillating at an initial frequency, a power amplifier that amplifies the signal to produce an amplified oscillating signal, a filter that filters the amplified oscillating signal to produce an output signal that supplies power to a plasma load in a plasma processing chamber, a sensor that senses at least one property of the plasma load, and a frequency-tuning subsystem.

The frequency-tuning subsystem includes a non-transitory, tangible, machine-readable medium encoded with instructions to perform a method that includes receiving an impedance trajectory of the plasma load as a function of exciter frequency; receiving a reference point in a complex-reflection-coefficient plane, the reference point lying on a reference vector that passes through the reference point and an origin of the complex-reflection-coefficient plane; receiving, from the sensor, a measured impedance of the plasma load, the measured impedance lying along the received impedance trajectory; determining a measurement angle between the reference vector and a line passing through the reference point and a point in the complex-reflection-coefficient plane corresponding to the measured impedance, as expressed in terms of complex reflection coefficient; scaling the measurement angle by a predetermined constant to produce a frequency step; adding the frequency step to the initial frequency to produce an adjusted frequency; and causing the exciter to generate a signal oscillating at the adjusted frequency.

Another aspect may be characterized as the method including repeating iteratively the receiving, from the sensor, a measured impedance, the determining, the scaling, the adding, and the causing, the initial frequency in each iteration subsequent to a first iteration being the adjusted frequency produced during an immediately preceding iteration.

Yet another aspect may be characterized as the method including producing the frequency step by subtracting a predetermined detuning angle from the measurement angle and scaling the difference by a predetermined constant.

DETAILED DESCRIPTION

An apparatus for frequency tuning in a radio-frequency (RF) generator can provide both stability and rapid tuning if (1) the frequency of the RF generator is adjusted in the correct direction (up or down) at each frequency-adjustment iteration and (2) the frequency step (adjustment in frequency) is made adaptive, such that a large step is applied when the current frequency is far from the target frequency (promotes rapid tuning), and a small step is applied when the current frequency is close to the target frequency (promotes stability). As explained further below, in some embodiments the target frequency corresponds to minimum Γ (complex reflection coefficient), and, in other embodiments (detuned embodiments), the target frequency corresponds to an intentionally selected Γ other than the minimum Γ.

One key to achieving these objectives is to characterize the impedance of the plasma load as a function of generator frequency beforehand. Such characterization can be accomplished through analysis of circuit models, through preliminary testing (measurements), or a combination of these techniques. For example, the impedance of the plasma load can be measured at each of a number of different frequencies over a particular range (e.g., 13 MHz to 14 MHz). Such preliminary characterization can produce an "impedance trajectory" for the load as a function of generator frequency. This impedance trajectory can be expressed in terms of complex reflection coefficient Γ, as discussed further below. Once this impedance trajectory is known, it is possible to compute the correct frequency-step direction (positive or negative) and appropriate frequency-step size at each frequency-adjustment iteration, as explained further below.

Figure 1:
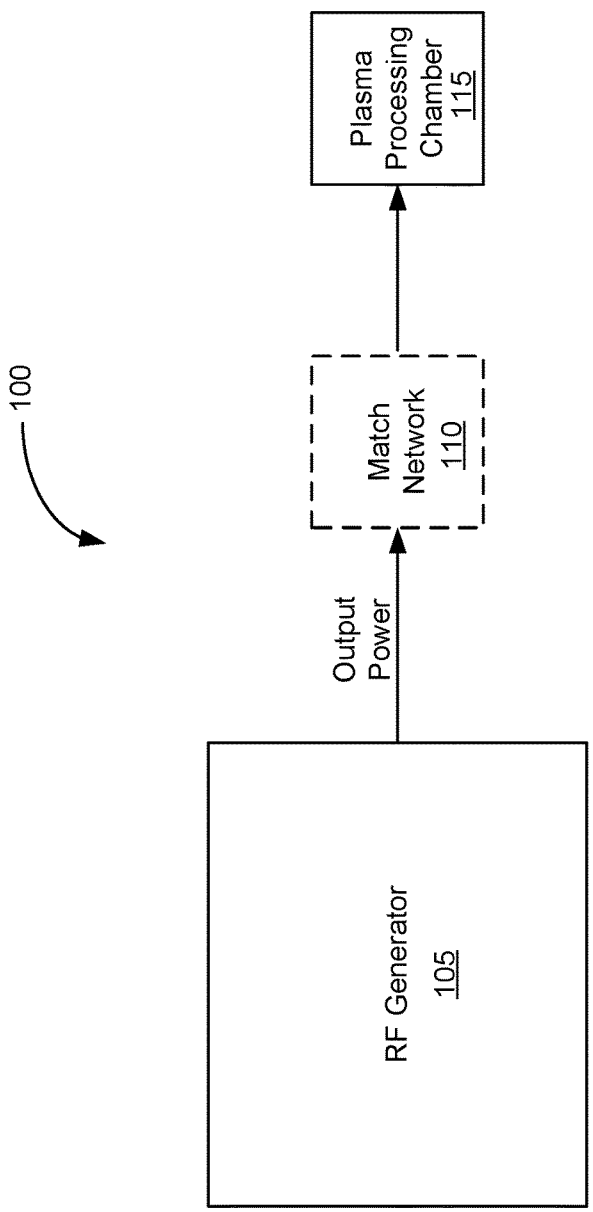
FIG. 1 is a block diagram of a plasma processing system in accordance with an embodiment of this disclosure.

Referring now to the drawings, where like or similar elements are designated with identical reference numerals throughout the several views, and referring in particular to FIG. 1, it is a block diagram of a plasma processing system in accordance with an embodiment of this disclosure. In FIG. 1, plasma processing system 100 includes RF generator 105, which outputs power to a plasma (not shown) in plasma processing chamber 115 directly or indirectly via one or more matching networks 110. Herein, the term "plasma load" is used to mean the plasma in plasma processing chamber 115 in combination with any matching network 110 that might be present, depending on the particular embodiment (some embodiments do not include a matching network 110). In other words, "plasma load" refers to the entire load that the output of RF generator 105 drives.

Figure 2:
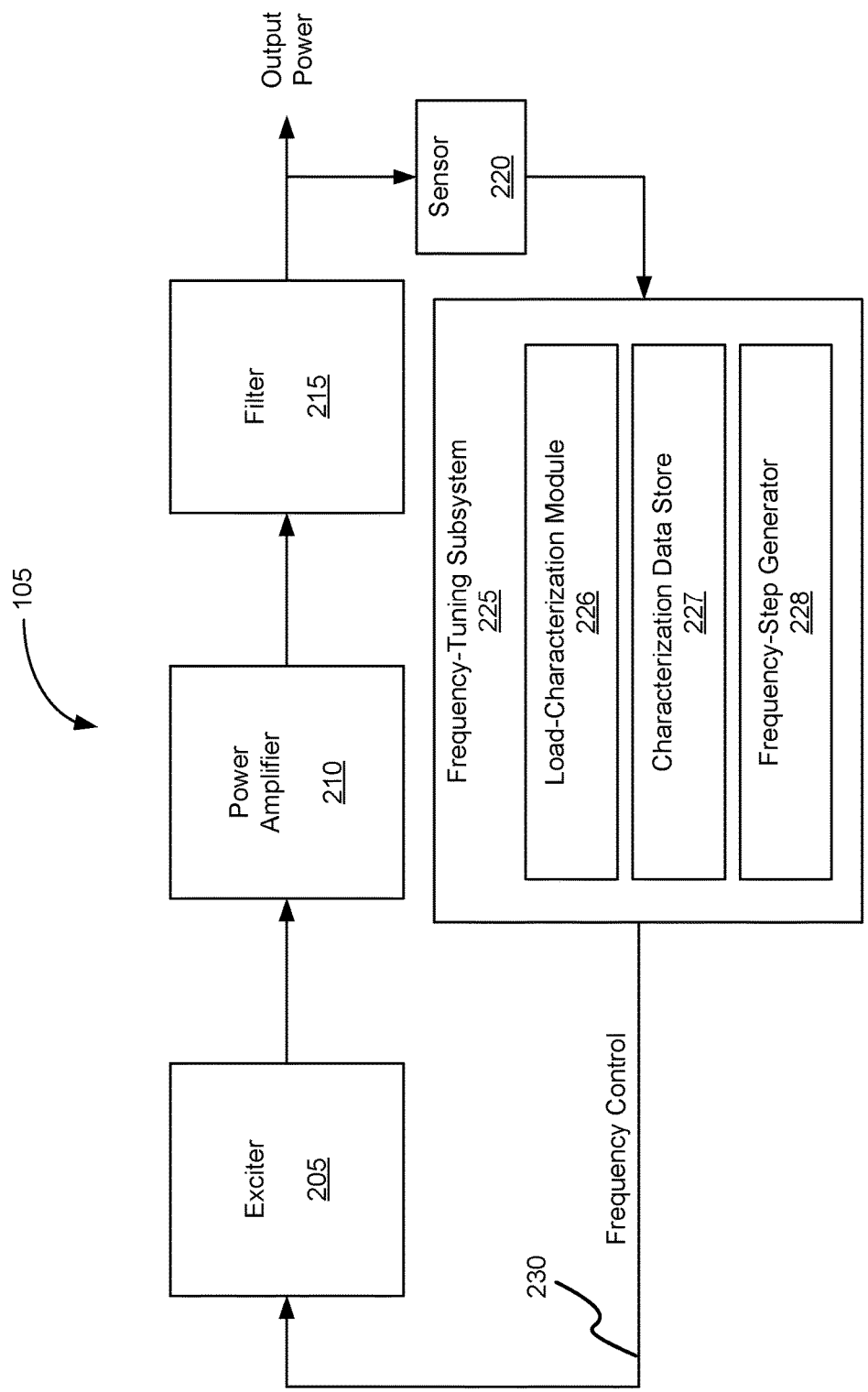
FIG. 2 is a block diagram of a RF generator in accordance with an embodiment of this disclosure.

FIG. 2 is a block diagram of RF generator 105 in accordance with an embodiment of this disclosure. RF generator 105 includes exciter 205, power amplifier 210, filter 215, sensor 220, and frequency-tuning subsystem 225. Exciter 205 generates an oscillating signal at RF frequencies, typically in the form of a square wave. Power amplifier 210 amplifies the signal produced by exciter 205 to produce an amplified oscillating signal. For example, in one embodiment power amplifier 210 amplifies an exciter output signal of 1 mW to 3 kW. Filter 215 filters the amplified oscillating signal to produce a signal composed of a single RF frequency (a sinusoid).

Sensor 220 measures one or more properties of the plasma load in plasma processing chamber 115. In one embodiment, sensor 220 measures the impedance Z of the plasma load. Depending on the particular embodiment, sensor 220 can be, for example and without limitation, a VI sensor or a directional coupler. Such impedance can alternatively be expressed as a complex reflection coefficient, which is often denoted as "Γ" (gamma) by those skilled in the art. Frequency-tuning subsystem 225 receives impedance measurements from sensor 220 and processes those measurements to produce frequency adjustments that are fed to exciter 205 via frequency control line 230 to adjust the frequency generated by exciter 205. Illustrative frequency-tuning algorithms that are performed by frequency-tuning subsystem 225 are discussed in detail below in connection with FIGS. 3-10.

In the embodiment shown in FIG. 2, frequency-tuning subsystem includes load-characterization module 226, characterization data store 227, and frequency-step generator 228. Load-characterization module 226 receives or assists in acquiring preliminary load-impedance characterization data associated with a particular plasma load to produce an impedance trajectory (see Element 305 in FIG. 3). The data obtained during load characterization can be stored in characterization data store 227. Frequency-step generator 228 performs the computations to generate frequency adjustments (frequency steps) that are fed to exciter 205 via frequency control line 230. Specific illustrative frequency-tuning algorithms performed by frequency-tuning subsystem 225 are discussed below in connection with FIGS. 3-10.

As discussed further below, in some embodiments, the objective is to adjust the frequency of exciter 205, thereby changing the impedance of the plasma load, in a manner that minimizes Γ (i.e., that achieves a Γ as close to zero as possible). As mentioned above, the frequency that achieves this minimum Γ may be termed the target frequency. As those skilled in the art understand, an ideal complex reflection coefficient of zero corresponds to a matched condition in which the source and plasma-load impedances are perfectly matched. In other embodiments, the objective is not minimum Γ. Instead, frequency-tuning subsystem 225 intentionally tunes exciter 205 to generate a frequency other than the one that produces minimum Γ. Such an embodiment may be termed a "detuned" implementation.

Figure 3:
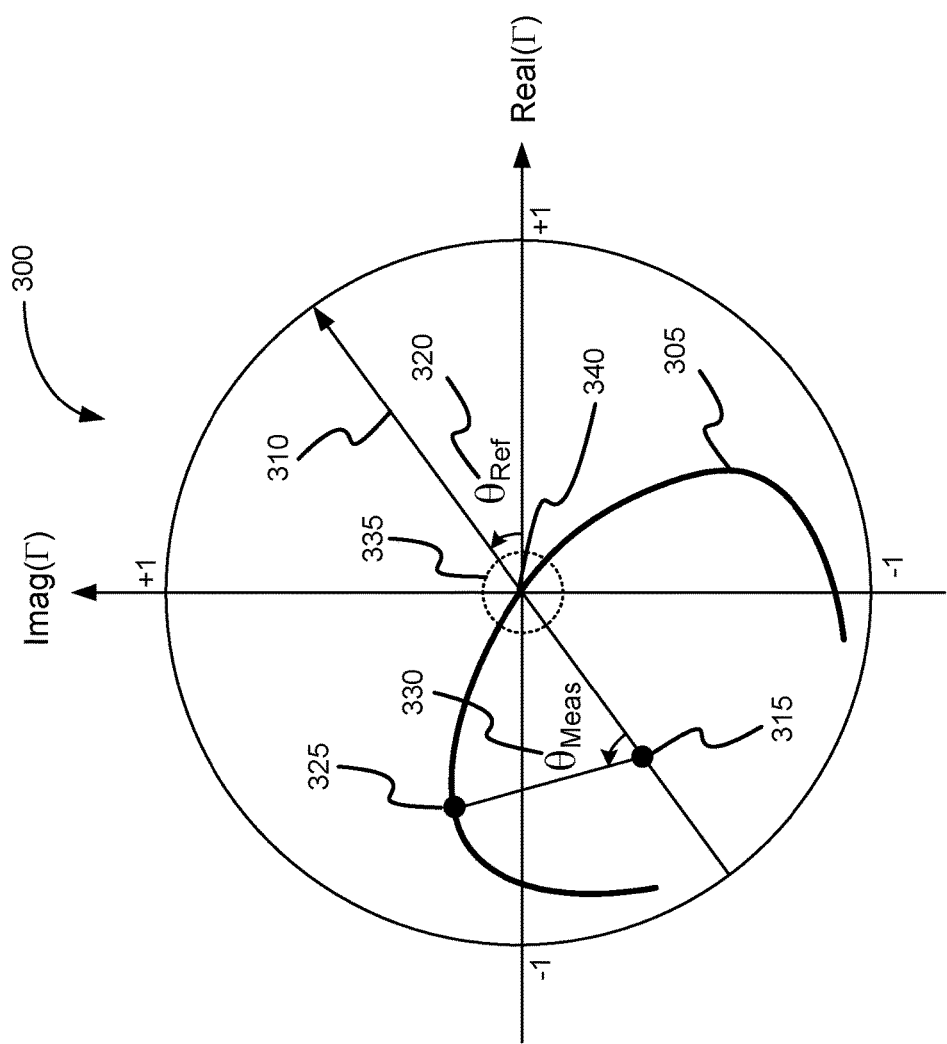
FIG. 3 is an illustration of a complex-reflection-coefficient plane in accordance with an embodiment of this disclosure.

FIG. 3 is an illustration of a complex-reflection-coefficient (Γ) plane 300 in accordance with an embodiment of this disclosure. FIG. 3 illustrates concepts relating to the algorithms carried out by frequency-tuning subsystem 225. In FIG. 3, complex reflection coefficients Γ are plotted within a unit circle. As those skilled in the art will recognize, Γ can also be plotted on a standard Smith Chart. In FIG. 3, the horizontal axis corresponds to the real part of Γ, and the vertical axis corresponds to the imaginary part of Γ. FIG. 3 shows a pre-characterized impedance trajectory 305 of the plasma load expressed in terms of Γ. As discussed above, impedance trajectory 305 can be determined in advance through analysis, testing performed with the aid of load-characterization module 226 via an appropriate user interface, or a combination thereof. Those skilled in the art will recognize that impedance trajectory 305 will not always intersect origin 340, as shown in FIG. 3. In some embodiments, impedance trajectory is shifted such that it does not pass through origin 340, in which case the minimum achievable Γ is greater than zero.

Frequency-step generator 228 of frequency-tuning subsystem 225 also receives, via a suitable user interface, a reference point 315 in Γ plane 300. In some embodiments, reference point 315 is specified in terms of a reference angle 320 and a magnitude (distance of the reference point from origin 340). As those skilled in the art will recognize, origin 340 corresponds to the point with coordinates (0, 0) at the center of the unit circle in Γ plane 300. Those skilled in the art also understand that it is straightforward to compute Cartesian coordinates for reference point 315, given reference angle 320 and a magnitude M. Specifically, the coordinates can be computed as Real(Γ)=M cos(θ$_{Ref}$+π) and Imag(Γ)=M sin(θ$_{Ref}$+π), where the reference angle θ$_{Ref}$ (320) is expressed in radians and M is a positive real number less than or equal to unity. In other embodiments, reference point 315 is received in terms of Cartesian coordinates (real part and imaginary part).

Once the reference point has been received, frequency-step generator 228 of frequency-tuning subsystem 225 can determine a reference vector 310. Reference vector 310 is a line that passes through reference point 315 and origin 340 of Γ plane 300, as indicated in FIG. 3. One important function of reference vector 310 is to divide Γ plane 300 into two regions, one in which the frequency associated with a measurement point 325 is higher than the optimum frequency (the region in FIG. 3 to the right of reference vector 310) and one in which the frequency associated with a measurement point 325 is lower than the optimum frequency (the region in FIG. 3 to the left of reference vector 310). By determining in which of the two regions a measurement point 325 lies, a frequency adjustment in the correct direction (positive or negative) can be made at each and every frequency-adjustment iteration (see FIGS. 5-6 and 9-10 below).

Those skilled in the art will recognize that reference vector 310 need not be an axis of symmetry with respect to impedance trajectory 305, as expressed in terms of Γ. The choice of where to place reference point 315, which in turn determines reference vector 310, is somewhat arbitrary, though a choice should be made that makes possible the calculation of useful measurement angles 330 that support effective frequency tuning. That means choosing a reference point 315 such that the measurement angle 330 decreases as the exciter 205 frequency approaches the target frequency, a measurement angle 330 of zero corresponding to the target frequency.

Sensor 220 provides frequency-tuning subsystem 225 with frequent measurements of the impedance of the plasma load in plasma processing chamber 115. Measurement point 325 in FIG. 3 represents one illustrative impedance measurement on impedance trajectory 305, as expressed in terms of Γ (complex reflection coefficient) in Γ plane 300. Frequency-step generator 228 of frequency-tuning subsystem 225 determines, for measurement point 325, a measurement angle 330 with respect to reference vector 310. This measurement angle 330 is scaled by a predetermined constant of proportionality K (the loop gain) to produce a frequency step (i.e., an amount by which the frequency generated by exciter 205 is to be adjusted). K is selected based on the frequency resolution of the frequency-tuning algorithm (e.g., 1 kHz vs. 1 Hz), the resolution of the measurement-angle calculations, and the particular impedance characteristics of the plasma load. The loop gain K can be different from recipe to recipe, and it can change within a given recipe in accordance with changes in the load impedance, in which case the multiple values of K employed in the recipe can be stored in a lookup table. The calculated frequency step is added to the initial or current exciter frequency to produce an adjusted frequency that is closer to the desired or target frequency corresponding to the desired plasma-load impedance. Frequency-tuning subsystem 225 then causes exciter 205, via frequency control line 230, to generate a RF signal at the adjusted frequency.

Also shown in FIG. 3 is a Γ threshold 335, the function of which will be explained below in connection with FIG. 6.

Figure 4:
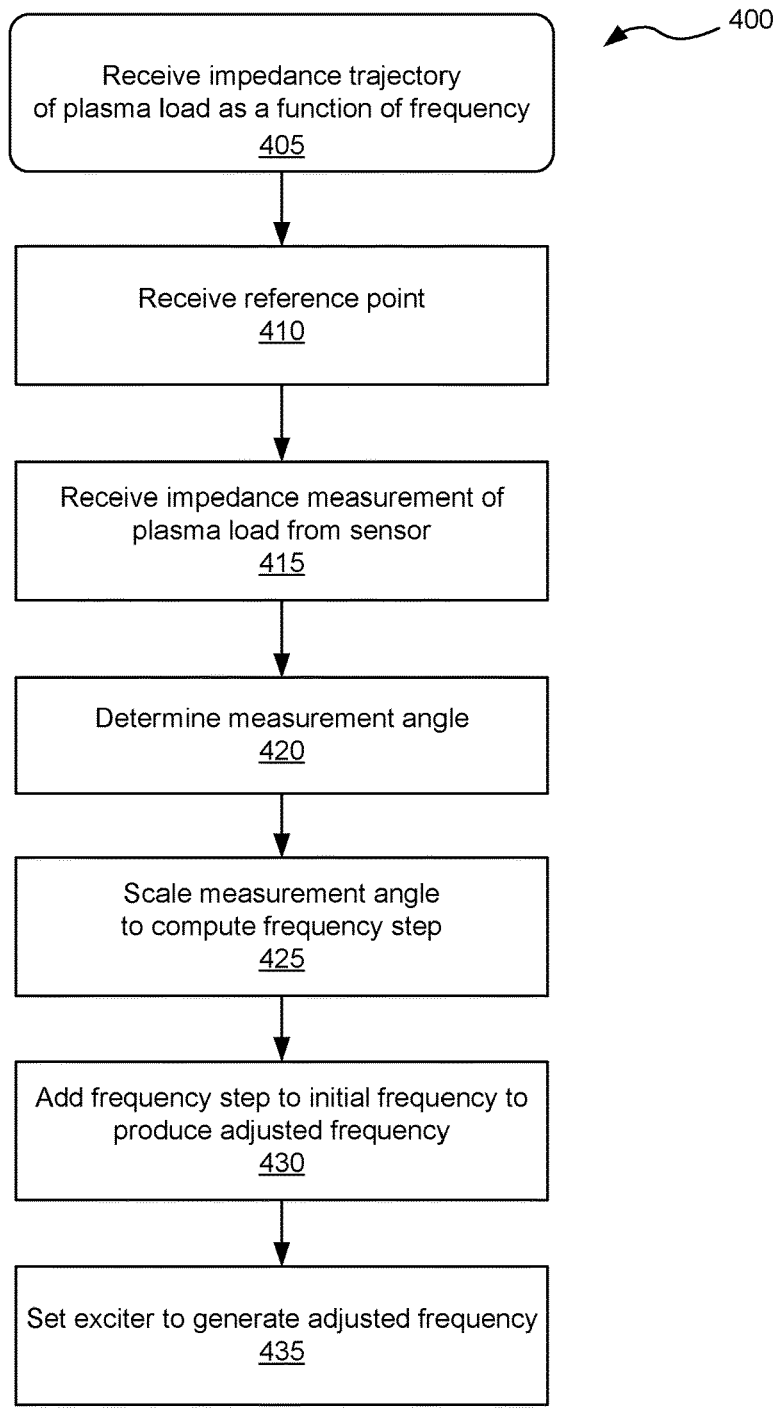
FIG. 4 is a flowchart of a method for tuning the frequency of a RF generator in accordance with an embodiment of this disclosure.

FIG. 4 is a flowchart of a method 400 for tuning the frequency of a RF generator in accordance with an embodiment of this disclosure. The method shown in FIG. 4 is performed by frequency-tuning subsystem 225. At Block 405, frequency-tuning subsystem 225 receives, via load-characterization module 226, an impedance trajectory 305 for the plasma load in plasma processing chamber 115. As explained above, impedance trajectory 305 can be expressed in terms of complex reflection coefficient (Γ), as shown in FIG. 3. At Block 410, frequency-step generator 228 of frequency-tuning subsystem 225 receives a reference point 315. At Block 415, frequency-step generator 228 receives an impedance measurement for the plasma load from sensor 220. At Block 420, frequency-step generator 228 determines a measurement angle 330 for the measurement point 325 corresponding to the received impedance measurement. At Block 425, frequency-step generator 228 then scales measurement angle 330 by a predetermined constant K to compute a frequency step. Note that, as method 400 commences, exciter 205 generates an oscillating RF signal at an initial frequency. At Block 430, frequency-step generator 228 adds the frequency step to the initial frequency generated by exciter 205 to produce an adjusted frequency. At Block 435, frequency-tuning subsystem 225, via frequency control line 230, signals exciter 205 to generate an oscillating RF signal at the adjusted frequency, which causes the impedance of the plasma load to change to a value closer to the desired load impedance.

Figure 5:
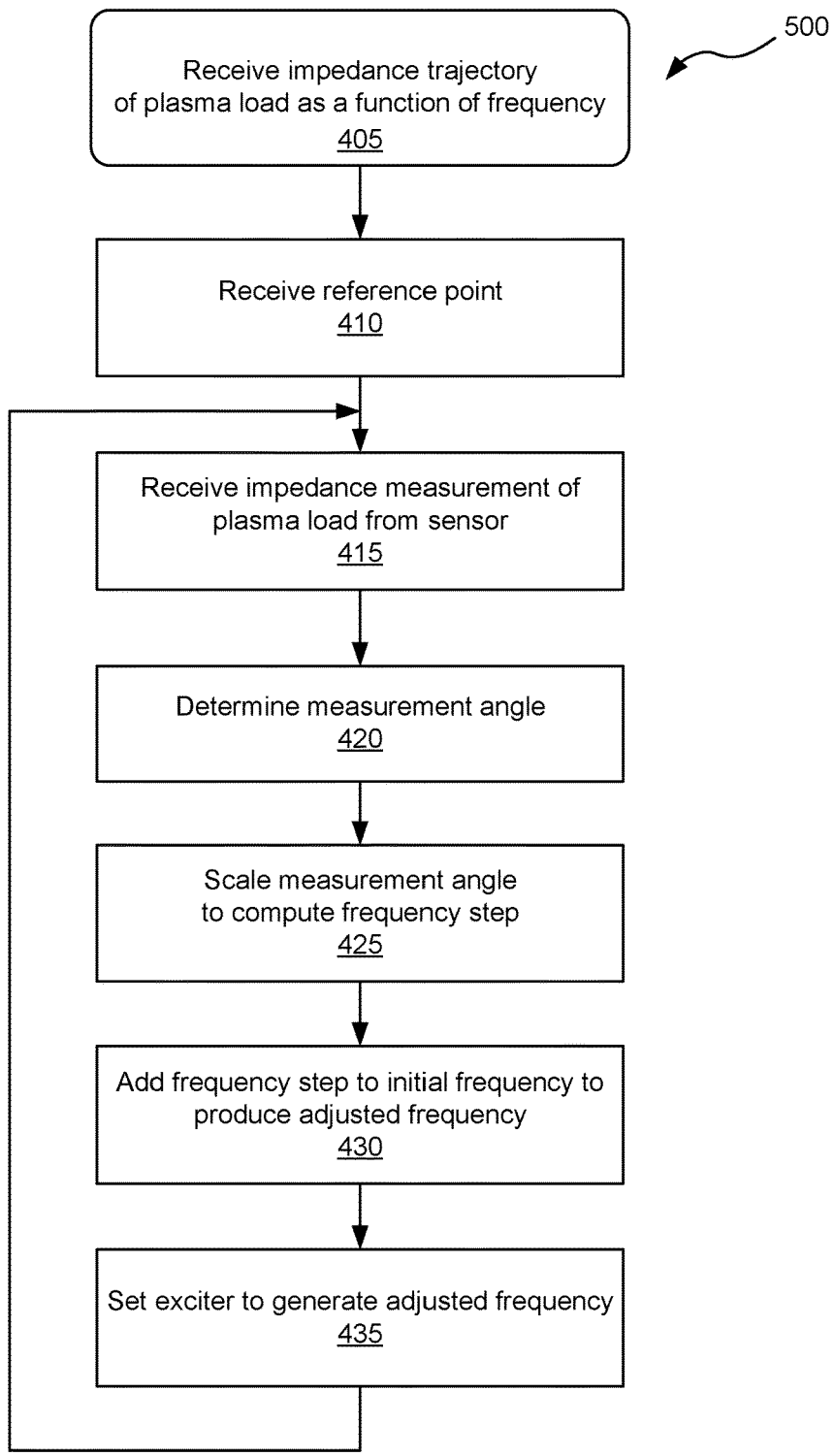
FIG. 5 is a flowchart of a method for tuning the frequency of a RF generator in accordance with another embodiment of this disclosure.

FIG. 5 is a flowchart of a method 500 for tuning the frequency of a RF generator in accordance with another embodiment of this disclosure. The method shown in FIG. 5 is performed by frequency-tuning subsystem 225. Method 500 is similar to method 400, except that, in method 500, the operations performed at Blocks 415, 420, 425, 430, and 435 (frequency tuning) are repeated iteratively in a loop. Those skilled in the art will recognize that, in this embodiment, the initial exciter 205 frequency at each iteration subsequent to the first iteration is the adjusted frequency produced during the immediately preceding iteration. This may be expressed mathematically as Adjusted Frequency (or Next Frequency) =Current Frequency+Frequency Step. In this embodiment, minimum Γ at or very near zero can be achieved as the algorithm converges to the optimum frequency.

Figure 6:
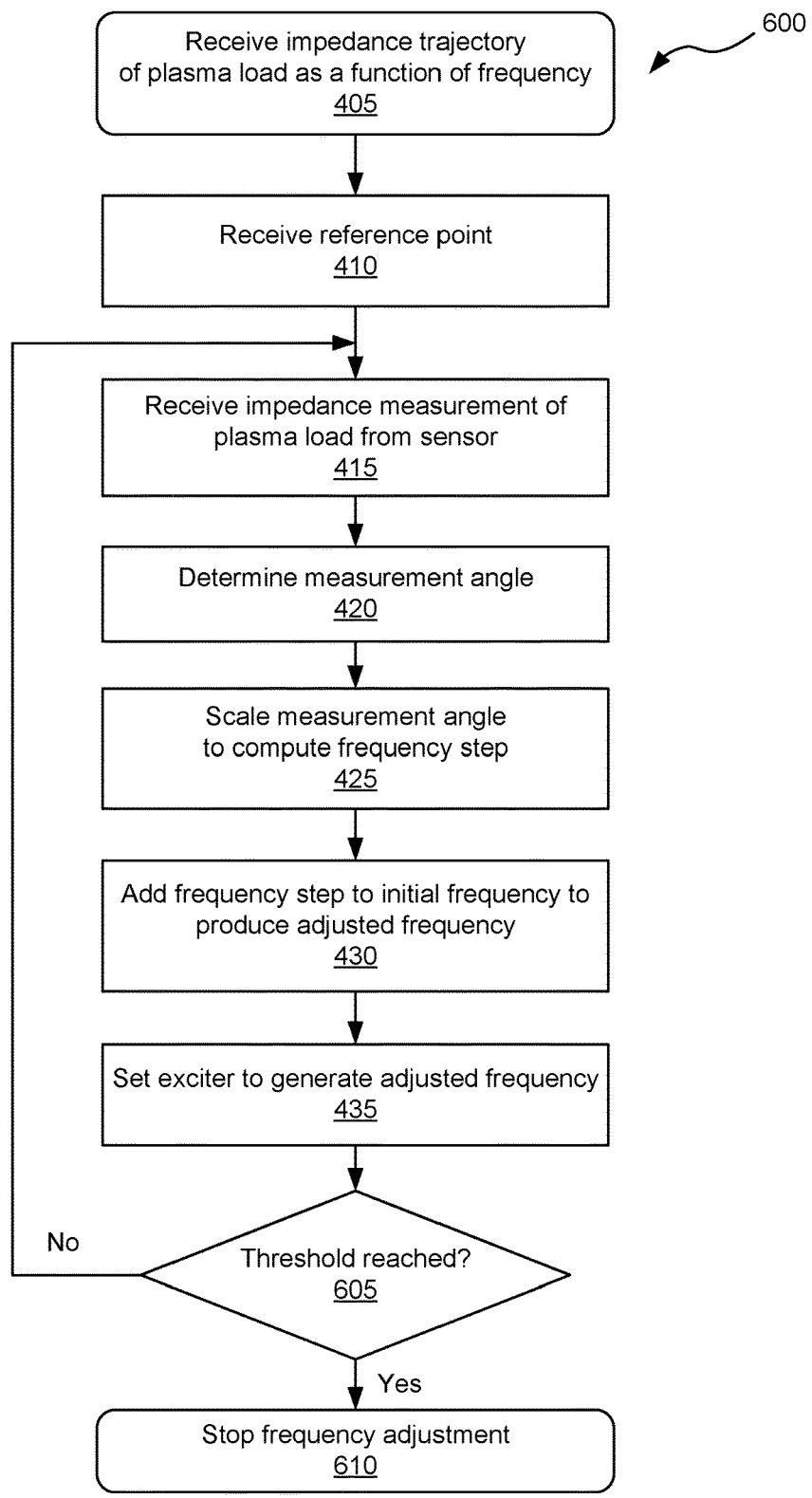
FIG. 6 is a flowchart of a method for tuning the frequency of a RF generator in accordance with yet another embodiment of this disclosure.

FIG. 6 is a flowchart of a method 600 for tuning the frequency of a RF generator in accordance with yet another embodiment of this disclosure. The method shown in FIG. 6 is performed by frequency-tuning subsystem 225. Method 600 is similar to methods 400 and 500, except that method 600 adds a Γ threshold 335 (a value between 0 and 1) for terminating frequency adjustment, once the frequency generated by exciter 205 has reached a value that produces a plasma-load impedance that is deemed sufficiently close to the desired value. Method 600 proceeds as in method 500 through Block 435. At Decision Block 605, frequency-step generator 228 determines whether Γ at the current measurement point 325 is smaller in magnitude than threshold 335 (shown in FIG. 3 as an equal-magnitude circular neighborhood surrounding origin 340). If so, frequency-step generator 228 terminates exciter 205 frequency adjustments at Block 610. In this situation, the exciter 205 frequency is maintained at its current value, and no further adjustments to the frequency are made. Otherwise, if the magnitude of Γ at the current measurement point 325 is greater than or equal to threshold 335, control returns to Block 415, and another iteration of exciter 205 frequency adjustment is performed.

FIGS. 7-10 introduce another family of embodiments in which the objective is not minimum Γ. As mentioned above, these embodiments may be termed a "detuned" implementation. In some implementations, a detuned configuration is chosen to achieve greater frequency stability with a particular plasma load, due to its particular impedance characteristics (impedance trajectory).

Figure 7:
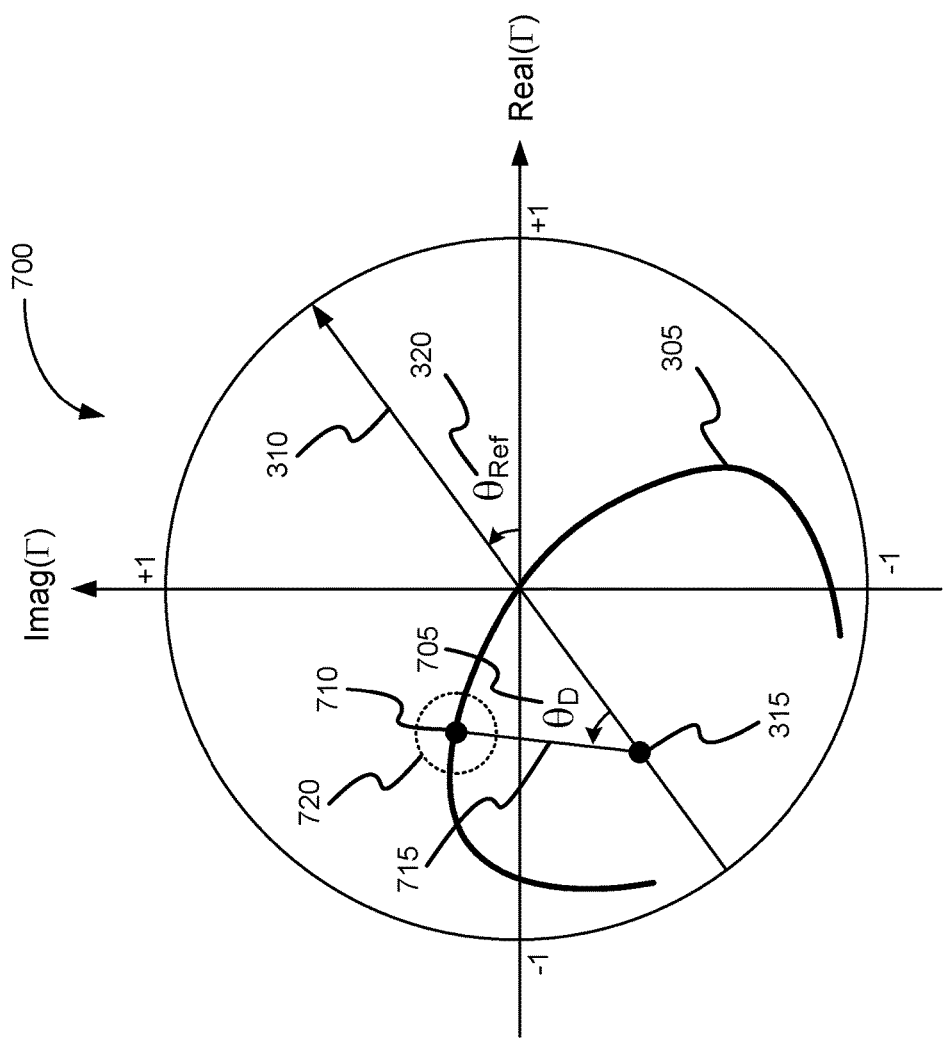
FIG. 7 is an illustration of a complex-reflection-coefficient plane in accordance with an embodiment of this disclosure.

FIG. 7 is an illustration of a complex-reflection-coefficient (Γ) plane 700 in accordance with an embodiment of this disclosure. For clarity, some elements shown in FIG. 3 are not repeated in FIG. 7, but FIGS. 3 and 7 are intended to be used together in connection with the detuned embodiments discussed below. Gamma plane 700, like Γ plane 300 discussed above, includes an impedance trajectory 305, as expressed in terms of Γ, a reference vector 310, a reference point 315, and a reference angle 320. Reference point 315 is received in the same manner explained above in connection with the embodiment in FIG. 3. Detuned embodiments such as that shown in FIG. 7 additionally include a detune point 710, which is a predetermined point on impedance trajectory 305. The angle between reference vector 310 and the "detune vector" 715 passing through reference point 315 and detune point 710 may be termed the "detune angle" 705. In detuned embodiments, the target frequency of the frequency-tuning algorithm is that corresponding to detune point 710 (i.e., the frequency that results in a load impedance corresponding to detune point 710 in Γ plane 700). Detune point 710 can be chosen to achieve the desired frequency stability. As explained further below, this detune angle 705 is subtracted from measurement angle 330 (see FIG. 3), and the resulting difference is scaled by a predetermined constant K. This causes the frequency tuning algorithm executed by frequency-step generator 228 to converge to a point on impedance trajectory 305 (i.e., detune point 710) other than the minimum-Γ point, which is origin 340 (see FIG. 3). As will be explained further below, the detuned embodiments can also make use of a Γ threshold 720.

Figure 8:
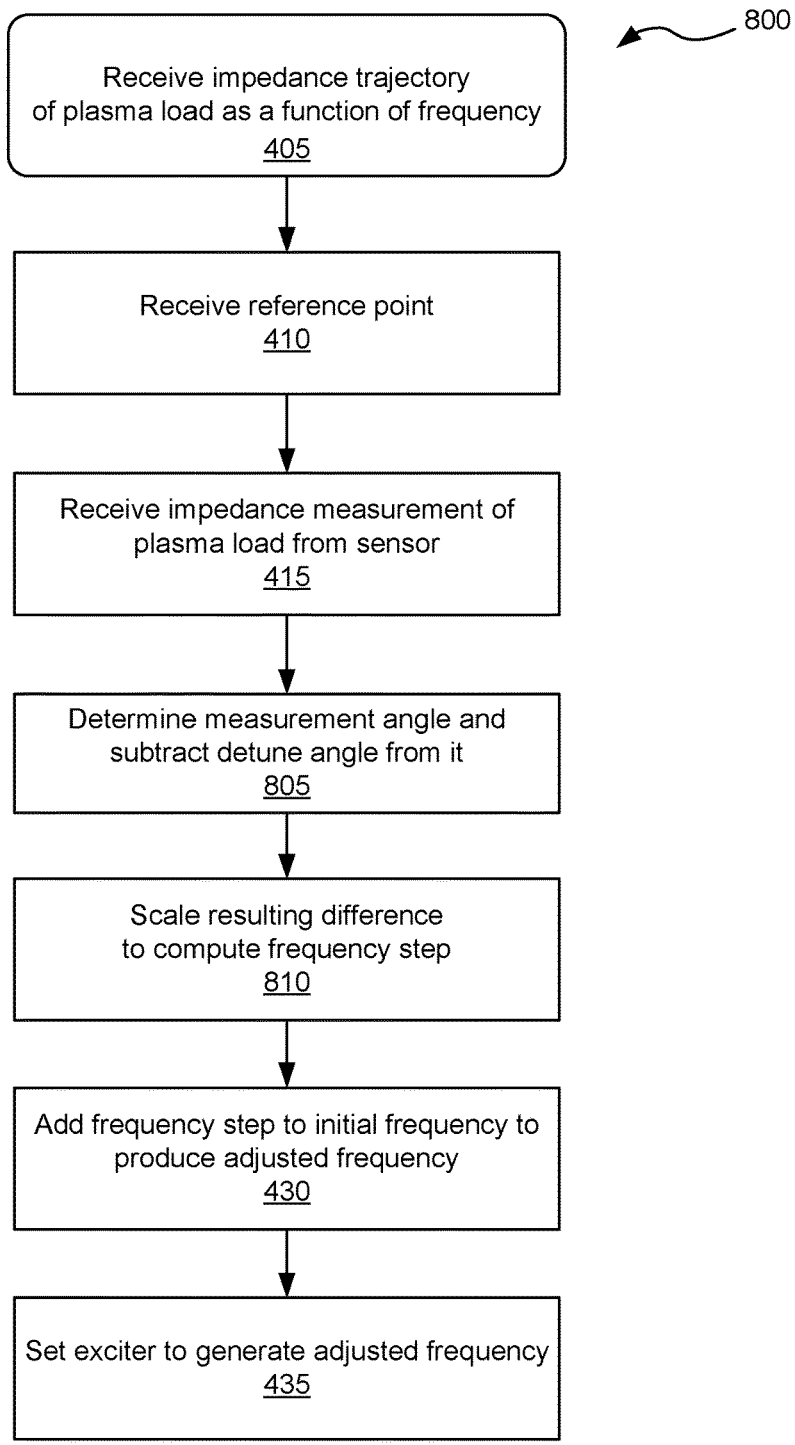
FIG. 8 is a flowchart of a method for tuning the frequency of a RF generator in accordance with an embodiment of this disclosure.

FIG. 8 is a flowchart of a method 800 for tuning the frequency of a RF generator in accordance with an embodiment of this disclosure. The method shown in FIG. 8 is performed by frequency-tuning subsystem 225. Method 800 is similar to method 400, except that, in method 800, frequency-step generator 228 subtracts detune angle 705 from measurement angle 330 at Block 805. At Block 810, frequency-step generator 228 scales the resulting difference by a predetermined constant K. The remaining operations (Blocks 430 and 435) are the same as in method 400 discussed above in connection with FIG. 4.

Figure 9:
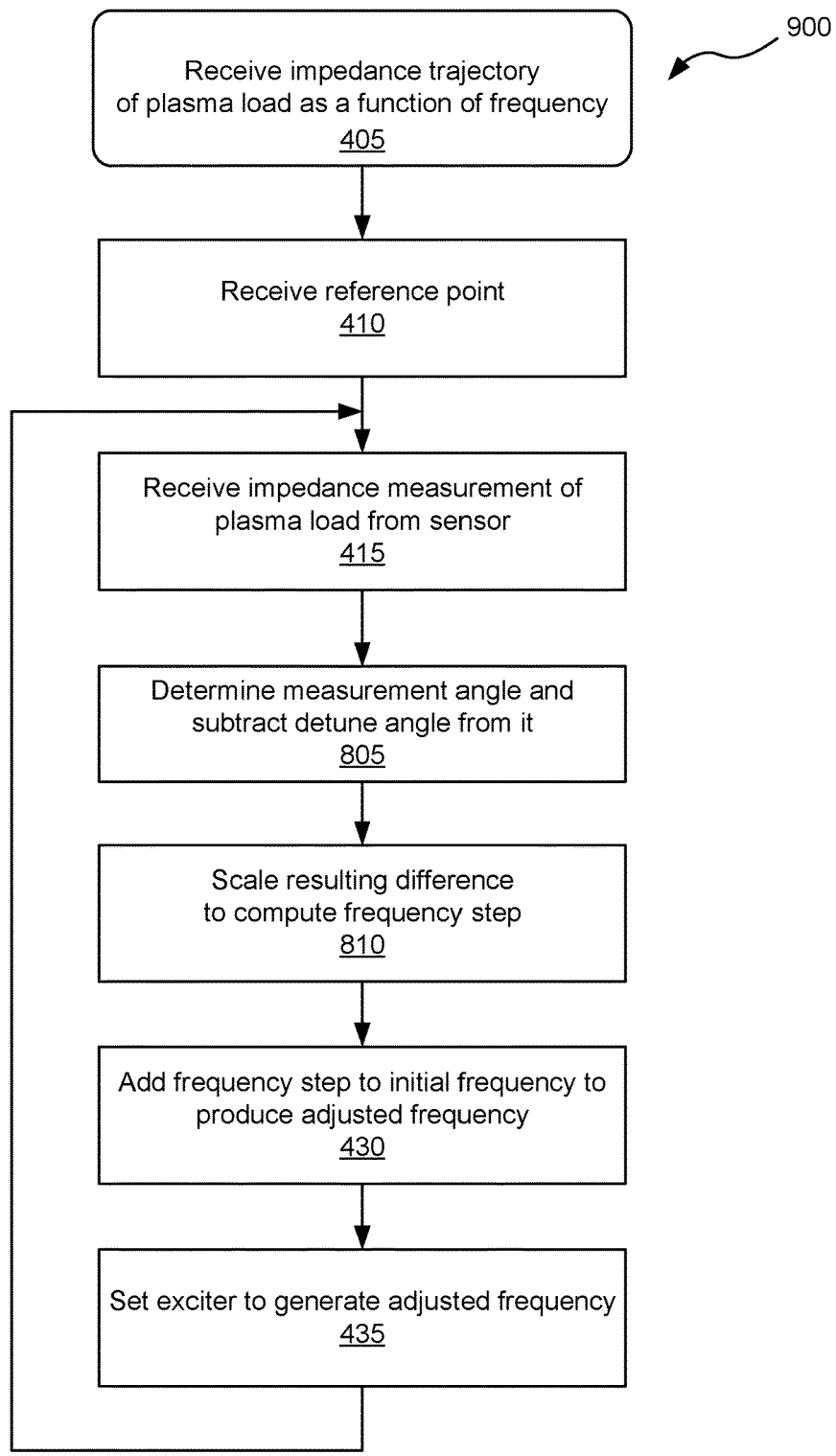
FIG. 9 is a flowchart of a method for tuning the frequency of a RF generator in accordance with another embodiment of this disclosure.

FIG. 9 is a flowchart of a method 900 for tuning the frequency of a RF generator in accordance with another embodiment of this disclosure. The method shown in FIG. 9 is performed by frequency-tuning subsystem 225. Method 900 is similar to method 800, except that, in method 900, the operations performed at Blocks 415, 805, 810, 430, and 435 (frequency tuning) are repeated iteratively in a loop. In this embodiment, exciter 205 frequency converges at or close to a frequency that produces a plasma-load impedance corresponding to detune point 710 on impedance trajectory 305, as expressed in terms of Γ.

Figure 10:
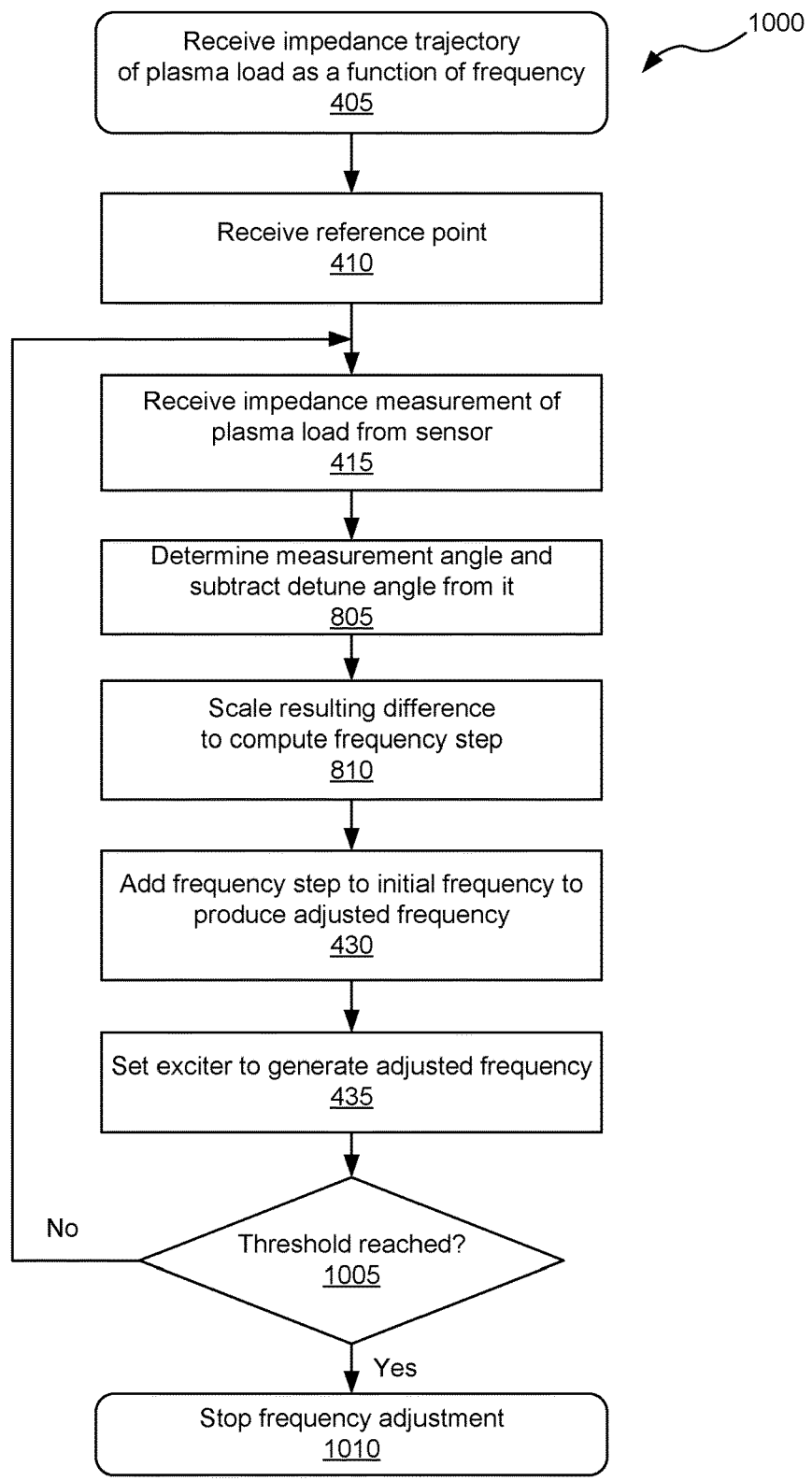
FIG. 10 is a flowchart of a method for tuning the frequency of a RF generator in accordance with yet another embodiment of this disclosure.

FIG. 10 is a flowchart of a method 1000 for tuning the frequency of a RF generator in accordance with yet another embodiment of this disclosure. The method shown in FIG. 10 is performed by frequency-tuning subsystem 225. Method 1000 is similar to methods 800 and 900, except that method 1000 adds a Γ threshold 720 for terminating frequency adjustment, once the exciter 205 frequency has reached a value that produces a plasma-load impedance that is deemed sufficiently close to that corresponding to detune point 710. Method 1000 proceeds as in method 900 through Block 435. At Decision Block 1005, frequency-step generator 228 determines whether the magnitude of the difference between the current measurement point 325 (expressed in terms of Γ, as shown in FIG. 3) and detune point 710 is less than threshold 720. If so, frequency-tuning subsystem 225 terminates exciter 205 frequency adjustments at Block 1010. Otherwise, control returns to Block 415, and another iteration of exciter 205 frequency adjustment is performed.

In some embodiments, frequency-step generator 228 raises measurement angle 330 to a power greater than unity before scaling the result by the predetermined constant (loop gain) K. This technique is one way of providing a frequency step that is relatively small when measurement angle 330 is small and relatively larger when measurement angle 330 is large. In other words, a frequency step that varies nonlinearly with measurement angle 330 can further improve the performance of frequency-tuning algorithms such as those described in connection with FIGS. 4-6 and 8-10.

Figure 11:
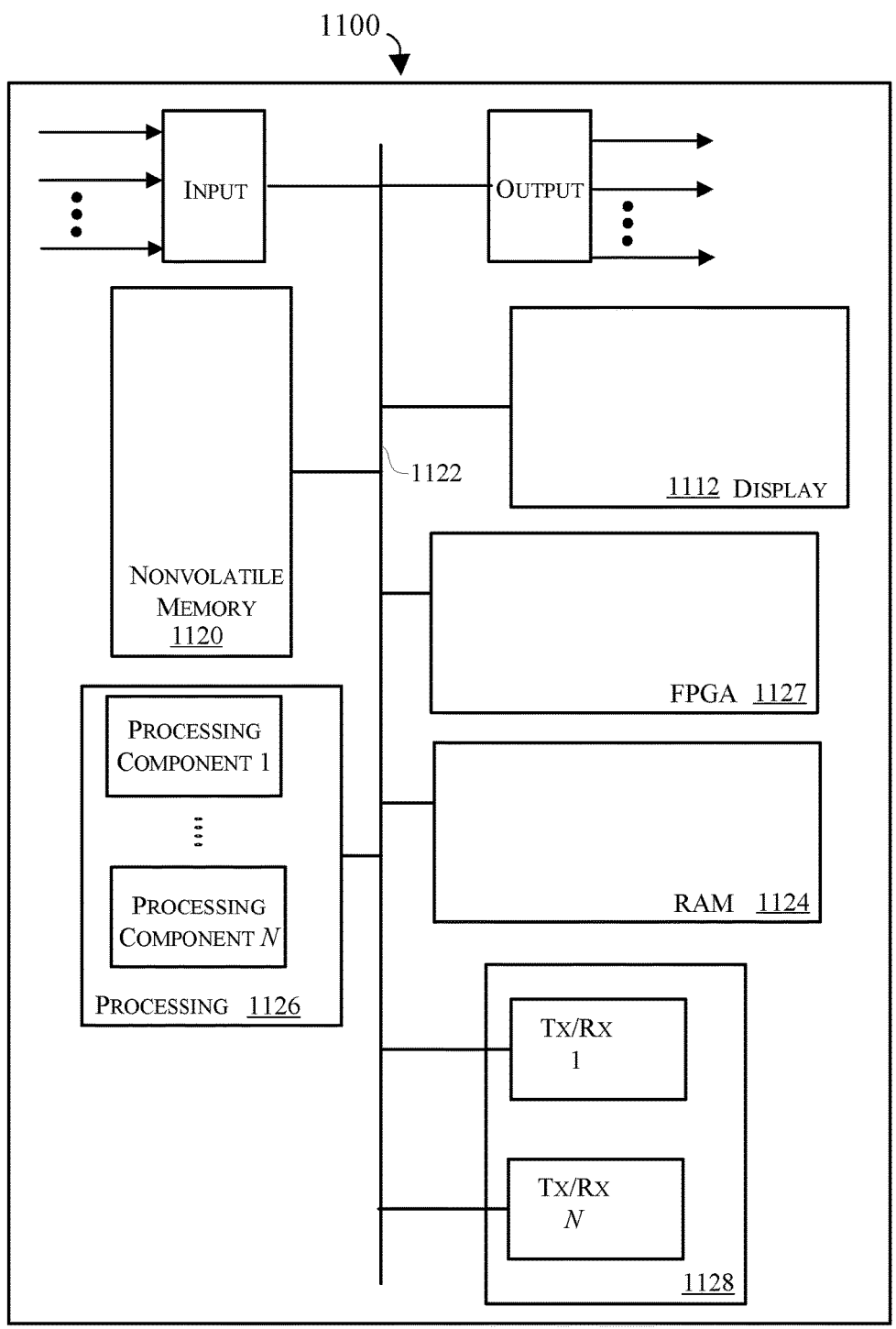
FIG. 11 is a block diagram depicting physical components that may be used to implement a frequency-tuning subsystem in accordance with an embodiment of this disclosure.

The methods described in connection with the embodiments disclosed herein may be embodied directly in hardware, in processor executable instructions encoded in non-transitory machine readable medium, or as a combination of the two. Referring to FIG. 11 for example, shown is a block diagram depicting physical components that may be utilized to realize a frequency-tuning subsystem 225 and its component modules according to an illustrative embodiment of this disclosure. As shown, in this embodiment a display portion 1112 and nonvolatile memory 1120 are coupled to a bus 1122 that is also coupled to random access memory ("RAM") 1124, a processing portion (which includes N processing components) 1126, a field programmable gate array (FPGA) 1127, and a transceiver component 1128 that includes N transceivers. Although the components depicted in FIG. 11 represent physical components, FIG. 11 is not intended to be a detailed hardware diagram; thus many of the components depicted in FIG. 11 may be realized by common constructs or distributed among additional physical components. Moreover, it is contemplated that other existing and yet-to-be developed physical components and architectures may be utilized to implement the functional components described with reference to FIG. 11.

Display portion 1112 generally operates to provide a user interface for a user, and in several implementations, the display is realized by a touchscreen display. For example, display portion 1112 can be used to control and interact with load-characterization module 226 in connection with characterizing a plasma load to produce an associated impedance trajectory 305. Such a user interface may also be used to input a reference point 315. In general, the nonvolatile memory 1120 is non-transitory memory that functions to store (e.g., persistently store) data and machine readable (e.g., processor executable) code (including executable code that is associated with effectuating the methods described herein). In some embodiments, for example, the nonvolatile memory 1120 includes bootloader code, operating system code, file system code, and non-transitory processor-executable code to facilitate the execution of the methods described with reference to FIGS. 4-6 and 8-10 described above.

In many implementations, the nonvolatile memory 1120 is realized by flash memory (e.g., NAND or ONENAND memory), but it is contemplated that other memory types may be utilized as well. Although it may be possible to execute the code from the nonvolatile memory 1120, the executable code in the nonvolatile memory is typically loaded into RAM 1124 and executed by one or more of the N processing components in the processing portion 1126.

In operation, the N processing components in connection with RAM 1124 may generally operate to execute the instructions stored in nonvolatile memory 1120 to realize the functionality of frequency-tuning subsystem 225. For example, non-transitory processor-executable instructions to effectuate the methods described with reference to FIGS. 4-6 and 8-10 may be persistently stored in nonvolatile memory 1120 and executed by the N processing components in connection with RAM 1124. As one of ordinary skill in the art will appreciate, the processing portion 1126 may include a video processor, digital signal processor (DSP), graphics processing unit (GPU), and other processing components.

In addition, or in the alternative, the field programmable gate array (FPGA) 1127 may be configured to effectuate one or more aspects of the methodologies described herein (e.g., the methods described with reference to FIGS. 4-6 and 8-10). For example, non-transitory FPGA-configuration-instructions may be persistently stored in nonvolatile memory 1120 and accessed by the FPGA 1127 (e.g., during boot up) to configure the FPGA 1127 to effectuate the functions of frequency-tuning subsystem 225.

The input component may operate to receive signals (e.g., from sensor 220) that are indicative of one or more properties of the output generator power and the plasma load in plasma processing chamber 115. The signals received at the input component may include, for example, voltage, current, forward power, reflected power, and plasma load impedance. The output component generally operates to provide one or more analog or digital signals to effectuate an operational aspect of the generator. For example, the output portion may transmit the adjusted frequency to exciter 205 via frequency control line 230 during frequency tuning.

The depicted transceiver component 1128 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A radio-frequency (RF) generator, comprising:
   an exciter that generates a signal oscillating at an initial frequency;
   a power amplifier that amplifies the signal to produce an amplified oscillating signal;
   a sensor that senses at least one property of the plasma load; and
   a frequency-tuning subsystem configured to receive a signal from the sensor indicative of impedance of the plasma load and provide a frequency control signal to the exciter, the frequency-tuning subsystem includes:
      a load-characterization module configured to characterize the plasma load as an impedance trajectory;
      a characterization data store to store the impedance trajectory for the plasma load; and
      a frequency-step generator configured to:
         receive the signal from the sensor indicative of impedance of the plasma load while processing is occurring in the plasma processing chamber;
         determine a measurement angle between a reference point and a point in a complex-reflection-coefficient plane corresponding to the impedance of the plasma load;
         scale the measurement angle by a constant to produce a frequency step;
         add the frequency step to the initial frequency to produce an adjusted frequency; and
         provide the frequency control signal at a level to the exciter so the exciter generates the signal oscillating at the adjusted frequency.

2. The RF generator of claim 1, wherein the RF generator supplies power to the plasma load through one or more matching networks.

3. The RF generator of claim 1, wherein the frequency-step generator includes a non-transitory, tangible, machine-readable medium encoded with instructions for repeating iteratively receiving the signal from the sensor, determining the measurement angle between the reference point and the point, scaling the measurement angle by the constant to produce the frequency step, adding the frequency step to the initial frequency to produce the adjusted frequency, and providing the frequency control signal at the level to the exciter so the exciter generates the signal oscillating at the adjusted frequency.

4. The RF generator of claim 3, wherein the instructions include instructions for repeating iteratively the receiving the signal from the sensor, the determining, the scaling, the adding, and the providing until a magnitude of a complex reflection coefficient corresponding to the impedance of the plasma load is smaller than a predetermined threshold.

5. The RF generator of claim 1, wherein the frequency-step generator is configured to produce the frequency step by subtracting a predetermined detuning angle from the measurement angle and scaling the difference by the constant.

6. The RF generator of claim 3, wherein the instructions include instructions for, at each iteration, producing the frequency step by subtracting a predetermined detuning angle from the measurement angle and scaling the difference by the constant.

7. The RF generator of claim 6, wherein the instructions include instructions for terminating iterative frequency adjustment when a magnitude of a difference between a complex reflection coefficient corresponding to the measured impedance and a predetermined detuning point on the impedance trajectory, as expressed in terms of complex reflection coefficient in the complex-reflection-coefficient plane, is smaller than a predetermined threshold.

8. The RF generator of claim 1, wherein the frequency-step generator us configured to produce the frequency step by raising the measurement angle to a power greater than unity and scaling the result by the constant.

9. A radio-frequency (RF) generator, comprising:
   means for generating a signal, the signal oscillating at an initial frequency;
   means for amplifying the signal to produce an amplified oscillating signal;
   means for filtering the amplified oscillating signal to produce an output signal that supplies power to a plasma load in a plasma processing chamber;
   means for characterizing the plasma load with an impedance trajectory of the plasma load as a function of frequency;

means for obtaining an impedance of the plasma load, the impedance lying along the impedance trajectory;

means for determining a measurement angle between a reference point and a point in the complex-reflection-coefficient plane corresponding to the impedance of the plasma load;

means for scaling the measurement angle by a constant to produce a frequency step;

means for adding the frequency step to the initial frequency to produce an adjusted frequency; and means for causing the means for generating a signal to generate a signal that oscillates at the adjusted frequency.

10. The RF generator of claim 9, wherein the RF generator supplies power to the plasma load through one or more matching networks.

11. The RF generator of claim 9, including means for iteratively:

determining the measurement angle;

scaling the measurement angle by the constant to produce the frequency step;

adding the frequency step to the initial frequency to produce the adjusted frequency; and causing the exciter to generate the signal oscillating at the adjusted frequency.

12. The RF generator of claim 11, including means for, until a magnitude of a complex reflection coefficient corresponding to the impedance of the plasma load is smaller than a predetermined threshold, iteratively:

obtaining the measured impedance of the plasma load;

determining the measurement angle between the reference point and the point in the complex-reflection-coefficient plane corresponding to the impedance of the plasma load;

scaling the measurement angle by the constant to produce the frequency step;

adding the frequency step to the initial frequency to produce the adjusted frequency; and causing the exciter to generate the signal oscillating at the adjusted frequency.

13. The RF generator of claim 9, including means for producing the frequency step by subtracting a predetermined detuning angle from the measurement angle and scaling the difference by the constant.

14. The RF generator of claim 11, including means for, at each iteration, producing the frequency step by subtracting a predetermined detuning angle from the measurement angle and scaling the difference by the predetermined constant.

15. The RF generator of claim 14, including means for terminating iterative frequency adjustment when a magnitude of a difference between a complex reflection coefficient corresponding to the impedance of the plasma load and a predetermined detuning point on the impedance trajectory, as expressed in terms of complex reflection coefficient in the complex-reflection-coefficient plane, is smaller than a predetermined threshold.

16. The RF generator of claim 9, including means for producing the frequency step by raising the measurement angle to a power greater than unity and scaling the result by the predetermined constant.

* * * * *